United States Patent
Yu

(10) Patent No.: US 6,693,333 B1
(45) Date of Patent: Feb. 17, 2004

(54) SEMICONDUCTOR-ON-INSULATOR CIRCUIT WITH MULTIPLE WORK FUNCTIONS

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/846,912

(22) Filed: May 1, 2001

(51) Int. Cl.⁷ .............................................. H01L 29/76
(52) U.S. Cl. ...................................... 257/407; 257/412
(58) Field of Search .............................. 257/402, 407, 257/412, 500; 438/585, 587, 588, 592, 656, 657, 685, FOR 177, FOR 254

(56) References Cited

U.S. PATENT DOCUMENTS

| | | | |
|---|---|---|---|
| 4,399,605 A | 8/1983 | Dash et al. | 438/154 |
| 4,974,056 A | 11/1990 | Brodsky et al. | 257/751 |
| 5,451,545 A * | 9/1995 | Ramaswami et al. | 438/649 |
| 6,028,339 A | 2/2000 | Frenette et al. | 257/364 |
| 6,091,115 A | 7/2000 | Ohtani et al. | 257/369 |
| 6,130,123 A | 10/2000 | Liang et al. | 438/217 |
| 6,140,688 A | 10/2000 | Gardner et al. | 257/412 |
| 6,190,952 B1 | 2/2001 | Xiang et al. | 438/155 |
| 6,221,708 B1 * | 4/2001 | Gonzalez et al. | 438/216 |
| 6,248,675 B1 | 6/2001 | Xiang et al. | 438/926 |
| 6,255,698 B1 | 7/2001 | Gardner et al. | 257/369 |
| 6,281,559 B1 | 8/2001 | Yu et al. | 257/407 |
| 6,373,111 B1 | 4/2002 | Zheng et al. | 257/407 |

FOREIGN PATENT DOCUMENTS

| | | | |
|---|---|---|---|
| JP | 3-61-152076 | 7/1986 | 257/411 |
| JP | 3-62-245658 | 10/1987 | 257/407 |
| JP | 4-02-002134 | 1/1990 | 257/344 |

OTHER PUBLICATIONS

Modified Salicide–Single Gate Electrode for CMOS FET Applications, Jan. 1985, IBM, Technical Disclosure Bulletin, NN85014751, vol. 27, Issue No. 8, pp. 4751–4752.

J. Chen et al., 0.18um Metal Gate Fully–Depleted SOI MOSFETs for Advanced CMOS Applications, 1999, Symposium on VLSI Technology Digest of Techincal Papers, pp. 25–26.

K. Nakajima et al., Work Function Controlled Metal Gate Electrode on Ultrathin Gate Insulators, 1999, Symposium on VLSI Technology digest of Technical Papers, pp. 95–96.

* cited by examiner

Primary Examiner—George Eckert
(74) Attorney, Agent, or Firm—Foley & Lardner

(57) ABSTRACT

An integrated circuit can include gate structures designed to effect a work function of a transistor. A first set of gate structures can have a first work function and a second set of gate structures can have a second work function. The gate structures include metal layers to affect changes in the work function. The work function can affect the threshold voltage associated with the transistors. The transistor can be built on a silicon-on-insulator substrate.

19 Claims, 2 Drawing Sheets

SEMICONDUCTOR-ON-INSULATOR CIRCUIT WITH MULTIPLE WORK FUNCTIONS

CROSS REFERENCE TO RELATED APPLICATIONS

This application is related to U.S. Pat. No. 6,127,216, issued on Oct. 3, 2000, by Lin, entitled "Heavily-Doped Polysilicon/Germanium Thin Film Formed by Laser Annealing." This application is also related to U.S. patent application Ser. No. 09/187,842, filed on Nov. 6, 1998, now issued U.S. Pat. No. 6.262,456, by Yu et al., entitled "Integrated Circuit Having Transistors with Different Threshold Voltages." This application is further related to U.S. Pat. No. 6,114,206, issued on Sep. 5, 2000, by Yu, entitled "Multiple Threshold Voltage Transistor Implemented by a Damascene Process." This application is even further related to U.S. patent application Ser. No. 09/261,274, filed on Mar. 3, 1999, now issued U.S. Pat. No. 6,281,559, by Yu, et al., entitled "Gate Stack Structure for Variable Threshold Voltage Circuit" and U.S. Pat. No. 6,190,952, issued on Feb. 20, 2001, by Xiang, et al., entitled "Multiple Semiconductor-on-Insulator Threshold Voltage Circuit".

FIELD OF THE INVENTION

The present invention relates generally to an integrated circuit (IC) and the fabrication of an integrated circuit. More particularly, the present invention relates to an integrated circuit with transistors having multiple threshold voltage values.

BACKGROUND OF THE INVENTION

Ultra-large-scale integrated (ULSI) circuits generally include a multitude of transistors, such as, more than one million transistors and even several million or more transistors, that cooperate to perform various functions for an electronic component. Some transistors on the integrated circuit (IC) or chip are part of circuits which perform different operations than other circuits.

Some transistors perform functions for circuits in the critical signal path of the IC, where speed is crucial to the proper operation of the IC. In contrast, other transistors perform functions for circuits in the noncritical signal path of the IC, where speed is not as important. Transistors in the non-critical signal path are preferably designed to consume less power than transistors in the critical signal path. Still other transistors may perform functions for a signal path having a criticality somewhere between the critical signal path and the non-critical signal path and, accordingly, have different speed and power consumption requirements.

Generally, transistors which have higher threshold voltages (Vth) consume less power than transistors which have low threshold voltages due to smaller off-state current leakage. Threshold voltage refers to the minimum gate voltage necessary for the onset of current flow between the source and the drain of a transistor. Transistors which have lower threshold voltages are faster (e.g., have quicker switching speeds) than transistors which have higher threshold voltages.

Currently, deep-submicron CMOS is the primary technology for ULSI devices. Over the last two decades, reduction in the size of CMOS transistors has been a principal focus of the microelectronics industry. However, as the sizes of the various components of the transistor are reduced, operational parameters and performance characteristics can change. Appropriate transistor performance must be maintained as transistor size is decreased.

One of the major roadblocks to transistor miniaturization is. related to subthreshold voltage characteristics. The subthreshold voltage characteristic refers to the relationship between voltage and current at gate voltages below the threshold voltage of the transistor (e.g., below turn-on voltages of the transistor). Generally, the threshold voltage characteristic of a transistor does not necessarily scale or change proportionally with the size of the transistor. The slope of the subthreshold voltage characteristic is related to $(\ln 10)(kT/q)$ where k is the Boltzman constant, T is absolute temperature, and q is the charge of electrons. As demonstrated by the above equation, a portion of the subthreshold voltage characteristic is independent of oxide thickness, channel length, and supply voltage. Thus, transistor performance at subthreshold voltage levels does not scale with respect to transistor structures and characteristics, such as, oxide thickness, channel length, and supply voltage.

Generally, the current at subthreshold voltage levels (e.g., the leakage current) in a transistor, such as, a MOSFET, increases exponentially as the threshold voltage decreases. Therefore, to maintain off-state current within standard specifications, the threshold voltage cannot be reduced appreciably in conventional ICs or chips. The current associated with subthreshold voltages is present whether or not the transistor is in operation and can cause the integrated circuit to have a high passive power output, which is particularly troublesome for low-power or portable systems.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate includes a buried insulative layer separating an upper semiconductor layer from the lower semiconductor base layer. The transistors on the insulative substrate have superior performance characteristics due to the thin-film nature of the semiconductor substrate and the insulative properties of the insulative substrate.

In a fully depleted (FD) MOSFET, the body thickness is so small that the depletion region has a limited vertical extension, thereby eliminating link effect and lowering hot carrier degradation. For example, a thin film FD SOI MOSFET can eliminate the need for an ultra-shallow junction which is a major challenge for proper transistor scaling. The superior performance of SOI devices is manifested in superior short-channel performance (i.e., resistance to process variation in small size transistor), near-ideal subthreshold voltage swing (i.e., steep subthreshold slope, good for low off-state current leakage), high saturation current, reduced junction capacitance, reduced junction leakage current, enhanced drive current, etc.

In ULSI circuits, transistors, such as, MOSFETs, with low threshold voltages can be used in logic paths which have high speed requirements. In contrast, transistors, such as, MOSFETs, with higher threshold voltages can be used in the non-critical signal path (e.g. storage devices), thereby reducing the off-state leakage current and, hence, reducing the standby power consumption of the entire IC.

ULSI circuits are generally manufactured in accordance with complementary metal oxide semiconductor (CMOS) technology and design criteria which utilize N-channel MOSFETs and P-channel MOSFETs. The N-channel and P-channel MOSFETs generally include a polysilicon gate structure disposed between a drain and a source. The polysilicon gate structure controls charge carriers in a channel region to turn the transistor on and off.

According to conventional bulk designs, multiple threshold voltages for transistors on a single IC are obtained by selectively providing channel implants for the transistors. Additional channel implants (e.g., doping the channel region to change the work function difference between the gate and the channel) are used for those transistors with higher threshold voltage requirements (e.g., Vth>0.3V). The transistors which have lower voltage threshold requirements (e.g., Vth≦0.2V–0.3V) do not receive the additional channel implants.

Utilizing channel implants to adjust the threshold voltages of transistors can be problematic because transistor short-channel performance is very susceptible to process variations. In particular, short-channel performance is extremely sensitive to channel implants or additional doping steps. Accordingly, the modification of the channel with implants can result in significantly different short-channel performance between transistors, which adversely affects the predictability of the design and operability of the IC. This characteristic is particularly problematic as transistors become smaller and packing densities increase. Additionally, providing channel implants adds additional steps to the fabrication process and makes the IC more difficult to manufacture.

Multiple threshold voltage devices can be particularly advantageous if a semiconductor-on-insulator or silicon-on-insulator (SOI) substrate is used. As stated above, junction capacitance is significantly reduced in SOI devices, especially in FD MOSFETs. Junction capacitance adversely affects the operational characteristics of the device. FD SOI MOSFETs also have a significantly lower subthreshold voltage slope. Therefore, the current at subthreshold voltage levels is lower when compared with conventional MOSFET at the same threshold voltage.

Certain FD SOI MOSFETs have differed from traditional MOSFETs in which the channel or body is adoped to adjust the threshold voltage. These MOSFETs have utilized a non-doped channel or body. The non-doped channel is generally preferred for thin-film FD SOI MOSFETs because it reduces random dopant fluctuation effects which adversely affect device electrical performance. However, adjustments to threshold voltages for these MOSFETs cannot be achieved through channel doping because the channel is undoped.

Thus, there is a need for an integrated circuit or electronic device that includes transistors having different threshold voltage levels which can be manufactured according to a simpler process. Further still, there is a need for an ULSI circuit that does not utilize channel implants to adjust threshold voltages among transistors. Even further still, there is a need for a process for fabricating transistors having multiple threshold voltages that is higher in density and can be more efficiently manufactured. Yet further still, there is a need for a FD SOI integrated circuit with multiple threshold voltages. Even further, there is a need for a transistor design in which the threshold voltage is locally adjustable or tunable.

SUMMARY OF THE INVENTION

An exemplary embodiment relates to an integrated circuit. The integrated circuit includes a number of gate structures. The gate structures are each disposed between a source region and a drain region. A first gate structure of the gate structures includes a first ultra-thin metal layer, and a second gate structure of the gate structures does not include the first ultra-thin metal layer. The first ultra-thin metal layer affects a work function associated with the first gate structure.

Another exemplary embodiment relates to a method of manufacturing an integrated circuit. The integrated circuit includes a number of transistors. The transistors include a first transistor having a first threshold voltage and a second transistor having a second threshold voltage. The first threshold voltage is different than the second threshold voltage. The method includes providing a mask above a first gate area for the first transistor and exclusive of a second gate area for the second transistor, providing a first metal layer above the mask and above the second gate area, and removing the mask and the first metal layer above the mask. The method further includes providing a gate material above the first gate area and above the metal layer above the second gate area.

Still another exemplary embodiment relates to a method of manufacturing an integrated circuit on a semiconductor-on-insulator substrate. The method includes providing a dielectric layer over the semiconductor-on-insulator substrate, providing a first metal layer over the gate dielectric layer, providing a mask over a first area of the first metal layer, providing a second metal layer over the mask and over a portion of the first metal layer, and forming a first gate structure. The first gate structure includes the first metal and does not include the second metal layer. The method further includes forming a second gate structure. The second gate structure includes the first metal layer and the second metal layer.

BRIEF DESCRIPTION OF THE DRAWINGS

The present invention will hereafter be described with reference to the accompanying drawings, wherein like numerals denote like elements, and.

DETAILED DESCRIPTION OF THE PREFERRED EMBODIMENTS

Figure 1:
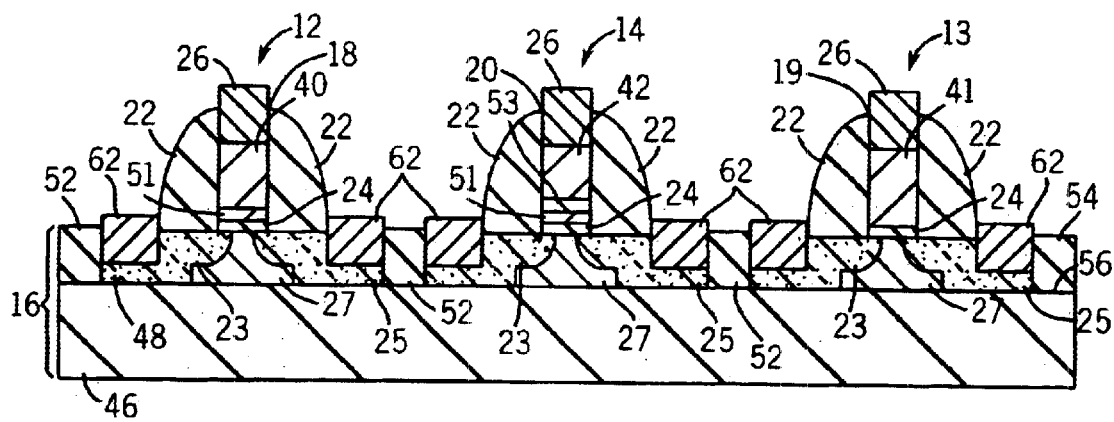
FIG. 1 is a cross-sectional schematic view of a portion of an integrated circuit in accordance with an exemplary embodiment, the integrated circuit provided on a semiconductor-on-insulator substrate.

With reference to FIG. 1, a portion 10 of an integrated circuit (IC) or chip includes a transistor 12, a transistor 13, and a transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12, 13 and 14 are disposed on a substrate 16 that is preferably a semiconductor-on-insulator or silicon-on-insulator (SOI) substrate. Transistor 12 includes a gate structure or stack 18, and transistor 14 includes a gate stack 20. Transistor 13 includes a gate stack 19. Transistors 12, 13, and 14 include a drain 23, a source 25, and a channel 27. Transistors 12, 13, and 14 have a threshold voltage between 0.15V and 0.4V or less.

Each of gate stack 18, gate stack 19, and gate stack 20 includes sidewall spacers 22, a gate dielectric 24, and a silicide layer 26. Silicide layer 26 is preferably a 100 to 200 Å thick layer of cobalt silicide. Alternatively, tungsten silicide or nickel silicide can be utilized.

Spacers 22 and gate dielectric 24 can be silicon dioxide or other insulating material. Spacers 22 are deposited as a silicon dioxide layer by chemical vapor deposition (CVD), which is selectively etched. Gate dielectric 24 is a thermally grown 50–10 Å thick layer of silicon dioxide. Alternatively, spacers 22 and dielectric 24 can be a silicon nitride ($Si_3N_4$) material or other insulative material.

Gate stack 18 includes a gate conductor 40, and gate stack 20 includes a gate conductor 42. Gate stack 19 includes a gate conductor 41. Gate conductors 40, 41, and 42 are preferably manufactured from a semiconductor material, such as, a 1000 to 2000 Å thick doped polysilicon layer.

Gate conductors 40, 41 and 42 can also be a compound material including germanium or a metal material. Gate conductor 40 is preferably thicker than gate conductor 42 and thinner than gate conductor 41. Preferably, gate conductor 41 is 10–30 Å thicker than gate conductor 40, and gate conductor 40 is 10–30 Å thicker than gate conductor 42.

Gate stack 18 includes a metal layer 51. Metal layer 51 is disposed between gate dielectric 24 and gate conductor 40. Gate stack 20 includes metal layer 51 and a metal layer 53. Metal layer 53 is disposed above metal layer 51. Metal layers 51 and 53 in stack 20 are disposed between gate conductor 42 and gate dielectric 24. Gate stack 19 does not include either metal layer 51 or metal layer 53. Gate conductor 41 is directly between silicide layer 26 and gate dielectric 24.

The work function of gate stacks 18, 19 and 20 is locally controlled by the presence of layers 51 and 53. Therefore, by inserting layers 51 and 53 above the gate areas for transistors 12 and 14, the threshold voltage can be adjusted.

Layers 51 and 53 are preferably very thin (ultra-thin layers such as 10–30 Å thick metal layers). Layers 51 and 53 can be nickel or titanium layers formed on top of each other or on top of gate dielectric 24. As described below, layers 51 and 53 can be deposited by molecular beam epitaxy (MBE) or atomic layer deposition (ALD).

The band structure of gate structures 18 and 19 is interfered by layers 51 and 53, thereby providing a different work function than gate structure 13. The presence of layers 51 and 53 adjusts the work function associated with the material of conductors 40, 41, and 42 (e.g., polysilicon). The work function near the bottom of the interface of gate stacks 18 and 20 is affected by the presence of layers 51 and 53.

The thickness and types of materials for layers 51 and 53 can be controlled to control the adjustment to the work function, thereby selecting threshold voltage. Therefore, by using two metal layers, at least three different transistors (transistors 12, 13, and 14) having three different threshold voltages can be formed. Alternatively, portion 10 can include only two transistors, such as transistors 14 and 13, transistors 12 and 14 or transistors 13 and 14, having two different threshold voltages.

Source regions 23 and drain regions 25 can be 50–300 Å thick. Regions 23 and 25 can also include extensions. Preferably, regions 23 and 25 are heavily doped with N-type dopants for an N-channel transistor (e.g., $5 \times 10^{19}$–$1 \times 10^{21}$ dopants per cubic centimeter). For a P-channel transistor, regions 23 and 25 are heavily doped with P-type dopants ($5 \times 10^{19}$–$1 \times 10^{21}$ dopants per cubic centimeter). An appropriate dopant for a P-channel transistor is boron, boron difluoride or indium, and an appropriate dopant for an N-type transistor is arsenic, phosphoric or antimony.

A channel region 27 between regions 23 and 25 can remain undoped. Alternatively, region 27 can be doped according to various device parameters. Regions 23 and 25 can be covered by a silicide layer 62 similar to silicide layer 26.

If transistors 12 and 14 are N-channel transistors, transistor 12 has a lower threshold voltage than transistor 14. Transistor 12 is preferably utilized in a critical signal path or high speed logic circuit. Conversely, if transistors 12 and 14 are P-channel transistors, transistor 12 has a lower (in absolute value) threshold voltage than transistor 14. In this P-channel embodiment, transistor 14 is utilized in the non-critical path, and transistor 12 is part of a critical signal path. If transistors 12, 13 and 14 are N-channel transistors, transistor 13 has the lowest threshold voltage.

Exemplary values for transistors 12 and 14 (N-channel) are given below. Transistor 12 (N-channel) has a threshold voltage of approximately 0.2V, and transistor 14 (N-channel) has a threshold voltage of approximately 0.32V. Transistors 12 and 14 are preferably fully depleted metal oxide semiconductor field effect transistors (FD MOSFETs).

Substrate 16 includes a buried oxide layer 46, and a semiconductor layer 48. A base layer such as several hundred micron thick layer of silicon can be disposed below layer 46. Buried oxide layer 46 is preferably a several thousand (3000–5000) Å thick layer of silicon dioxide. Layer 48 is preferably a thin-film layer of semiconductor material, such as, a 50–300 Å thick layer of silicon.

Substrate 16 may be purchased in a wafer form or may be configured from a silicon wafer to be of a form shown in FIG. 1. For example, layer 46 can be formed by implanting oxygen at a dose of $10^{17}$ dopants per $cm^2$ and annealing at a high temperature. Alternatively, layer 48 can be grown or deposited on layer 46. Layer 48 can be deposited on layer 46 by chemical vapor deposition (CVD).

Substrate 16 includes a shallow trench isolation structure 52. Structure 52 is preferably 1–2 microns wide and 50–300 Å deep and isolates transistors 12, 13 and 14 from each other. Preferably, structure 52 reaches from a top surface 54 of layer 48 to a bottom surface 56 of layer 48. Bottom surface 56 is adjacent layer 46. Structure 52 can be created by etching a trench in layer 48 and filling the trench with silicon dioxide in a tetraethylorthosilicate (TEOS) process.

Substrate 16 provides an SOI substrate that provides significant advantages over bulk-type substrates. However, transistors 12, 13, and 14 could utilize the principles of the present invention on a bulk-type substrate.

With reference to FIGS. 1–5, the fabrication of portion 10, including transistors 12, 13 and 14, is described below. The process advantageously locally tunes the threshold voltages of each of transistors 12, 13, and 14 by locally changing the gate work function.

Figure 2:
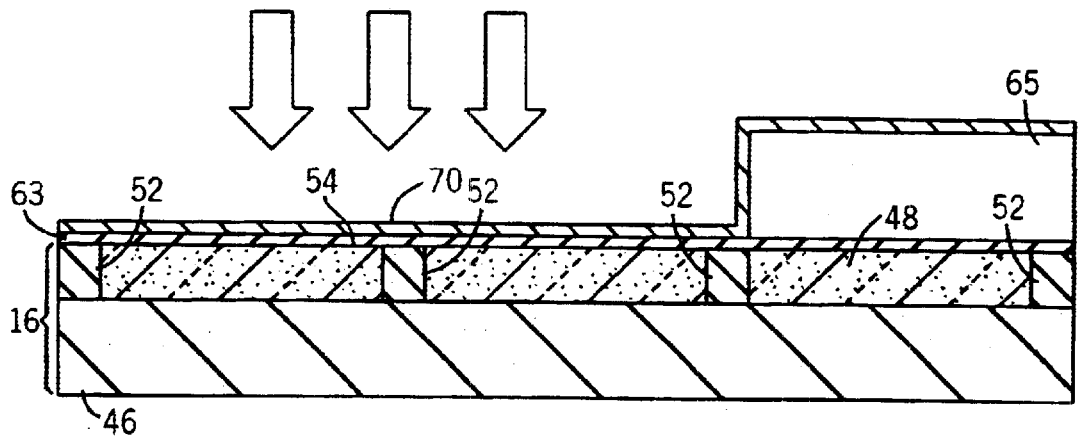
FIG. 2 is a cross-sectional schematic view of the portion of the substrate illustrated in FIG. 1, showing a dielectric layer deposition step, a photolithographic mask step, and metal deposition step.

In FIG. 2, portion 10 (FIG. 1) includes substrate 16 with structures 52. Structure 52 can also be LOCOS structures or other insulation structures. Preferably, structures 52 are fabricated in a conventional shallow trench isolation (STI) process.

A dielectric layer 63 is provided on top surface 54 of layer 48. Preferably, layer 63 is a 8–20 Å thick pad layer of silicon dioxide ($SiO_2$). Layer 63 corresponds to gate dielectric 24 (FIG. 1). Layer 63 can be thermally grown.

A mask layer 65 is provided over layer 63. Layer 65 is configured in accordance with a photolithographic technique to cover the gate area of transistor 13 and to be exclusive of the gate areas of transistors, 12 and 14 (FIG. 1). Layer 65 can be a conventional photoresist material. In one embodiment, layer 65 can cover the entire active region associated with transistor 13 (FIG. 1).

After mask layer 65 is configured (patterned), a metal layer 70 is deposited above gate dielectric layer 63 and above photoresist layer 65. Layer 70 is provided above the gate area associated with transistors 12 and 14 and corresponds to layer 51 of gate structures 18 and 20 (FIG. 1). Layer 70 is preferably a very thin metal layer, such as a nickel (Ni) or titanium (Ti) layer. Layer 70 can be deposited by MBE or ALD.

In a preferred exemplary embodiment, layer 70 is deposited by ALD. ALD refers to a surface reaction controlled process in which individual precursors are pulsed onto a surface (layer 63) sequentially. Each individual precursor reacts with the surface to form an atomic layer in such a manner that only one layer can form at a time. A first gas is absorbed on to the surface of layer 63. A second gas then reacts with the absorbed layer to form the ultra-thin monolayer. Genus, Inc., of Sunnyvale, Calif., includes ALD capabilities on its Lynx 2® wafer platform.

After patterning, layer 65 is removed, thereby removing layer 70 above layer 65. Therefore, removing layer 65 removes layer 70 from the gate area associated with transistor 19 (FIG. 1). The process selectively deposits layer 70 by using a photoresist lift off process. Layer 65 can be stripped in a conventional photoresist stripping process.

Figure 3:
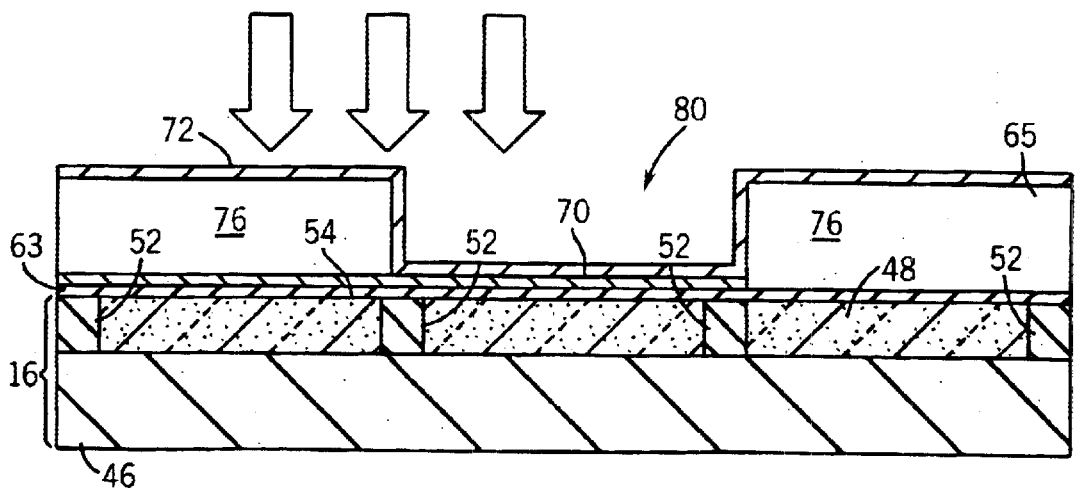
FIG. 3 is a cross-sectional schematic view of the portion of the substrate illustrated in FIG. 2, showing a mask removal step, a photolithographic mask step and a metal deposition step.

With reference to FIG. 3, after layer 70 is deposited, a mask layer 76 is provided above layer 70. Similar to layer 65, mask layer 70 can be configured in accordance with a photolithographic process to form an aperture 80 above the gate area associated with transistor 14. Layer 76 is preferably a photoresist material.

In one embodiment, aperture 80 can cover the entire active region associated with transistor 14. Alternatively, layer 70 is exclusive of only the gate area associated with transistor 14.

After layer 76 is configured (patterned), a metal layer 72 is deposited over layer 76 and over layer 70. Preferably, layer 72 is a very thin or ultra thin (10–30 Å thick) metal layer. Layer 72 can be similar to layer 70 and can be a nickel or titanium layer deposited by MBE or ALD.

Layer 72 preferably has a different work function associated with it than layer 70. Layer 72 corresponds to layer 53 of transistor 14 (FIG. 1). Preferably, layer 72 is a different material than layer 70 to provide a large tunable range for the gate stack work function.

Figure 4:
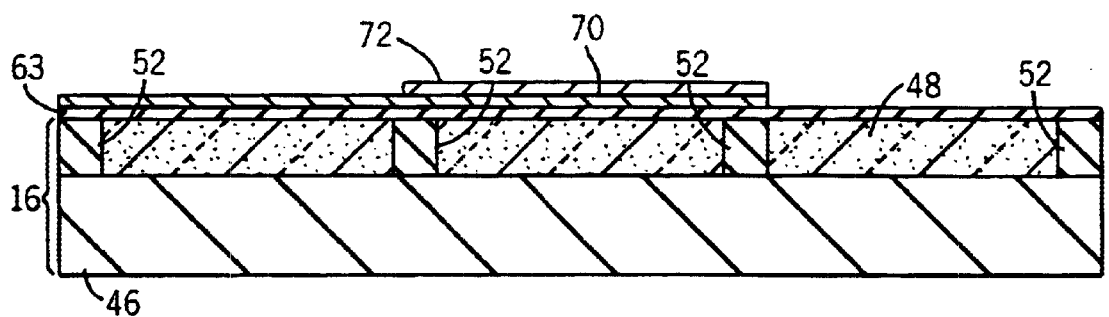
FIG. 4 is a cross-sectional schematic view of the portion of the substrate illustrated in FIG. 3, showing a mask removal step.

With reference to FIG. 4, after patterning layer 76, layer 76 is removed in a process similar to that used to remove layer 65. Removing layer 76 removes layer 72 above the gate area for transistor 12 and transistor 13. After layer 76 is removed, layer 72 remains above the gate area associated with transistor 14.

Figure 5:
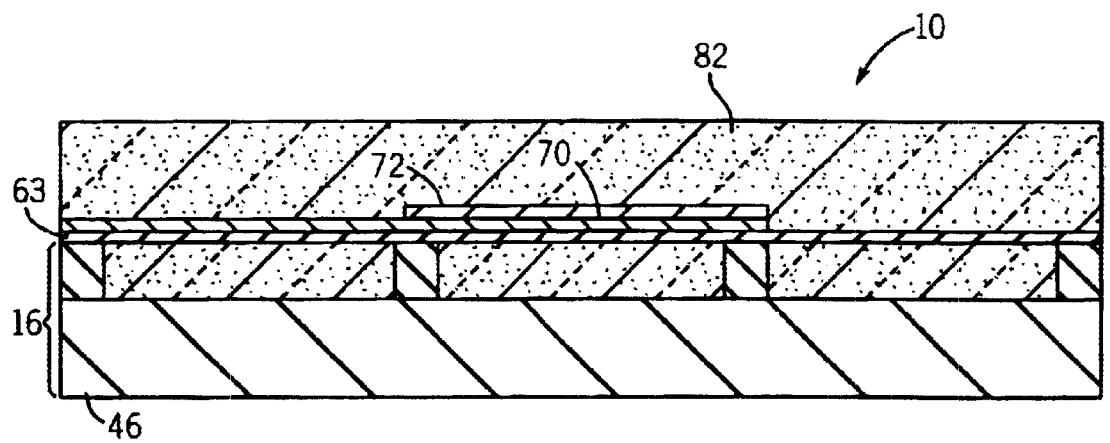
FIG. 5 is a cross-sectional schematic view of the substrate illustrated in FIG. 4, showing a gate material deposition step.

With reference to FIG. 5, a semiconductor material layer 82 is deposited above layer 63 (transistor 13), layer 72 (transistor 14), and layer 70 (transistor 12). Layer 82 can be a semiconductor material. In one preferred embodiment, layer 72 is a 1000–2000 Å thick polysilicon layer. Layer 82 corresponds to gate conductor 40, 41 and 42 of transistors 12, 13 and 14, respectively (FIG. 1). Alternatively, layer 82 can be other materials.

Layer 82 can be in situ doped. Alternatively, layer 82 can be doped after gate stacks 18, 19 and 20 are etched. Layer 82 can be heavily doped with P-type dopants. Layer 82 can also include other semiconductor materials such as germanium for adjusting the work function. According to another embodiment, layer 82 can include a metal material such as an aluminum material or alloy thereof.

With reference to FIG. 1, layers 82, 70 and 63 are selectively etched in accordance with a conventional process to form gate structures 18, 19 and 20. Conventional semiconductor processes are utilized to form the various structures shown in FIG. 1 including layers 26 and 62, spacers 22 and regions 23 and 25. For example, spacers 22 can be formed in a conventional deposition and etch back process. Regions 23 and 25 can be formed in a double implantation process, and layers 62 and 26 can be formed in a deposition and anneal process. Further, conventional techniques can be utilized to form contacts and inter connections for a portion 10 of the integrated circuit.

According to an alternative method, layers 70 and 72 can be selectively etched to leave the appropriate layers 51 and 53 for gate structures 18 and 20. For example, dry etching selective to the various materials utilized for layers 70 and 72 can be utilized. Alternatively, layer 65 can be replaced with other masking materials, including insulative or semiconductor masking materials which can be stripped from the underlying layer.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although particular metal films are described, other films can be utilized to achieve a tunable work function. Various changes may be made to the details disclosed without departing from the spirit of the invention which is defined by the following claims.

What is claimed is:

1. An integrated circuit comprising:
   a plurality of gate structures, the gate structures are each disposed between a source region and a drain region and include a polysilicon layer, wherein a first gate structure of the gate structures includes a first ultra-thin metal layer and a second gate structure of the gate structures does not include the first ultra-thin metal layer, wherein the first gate structure and the second gate structure include a second ultra-thin metal layer, wherein the first and second ultra-thin metal layers include a metal material, the metal material being a non-compound metal material, whereby the second ultra-thin metal layer affects the work function of the first gate structure and the second gate structure, whereby the first ultra-thin metal layer affects a work function associated with the first gate structure, wherein the first ultra-thin metal layer and the second ultra-thin metal are less than 30 Å thick, wherein the gate structures include a third gate a structure, the third gate structure not including the first ultra-thin metal layer or the second ultra-thin metal layer, whereby the third gate structure has a work function different than the first gate structure and the second gate structure.

2. The integrated circuit of claim 1, wherein the polysilicon layer is 1000 Å–2000 Å thick.

3. The integrated circuit of claim 1, wherein the gate structures are disposed on an SOI substrate.

4. The integrated circuit of claim 3, wherein the first ultra-thin metal layer includes nickel or titanium.

5. The integrated circuit of claim 4, wherein the first ultra-thin metal layer is deposited by ADL.

6. The integrated circuit of claim 1, wherein the gate structures further include a silicide layer above the polysilicon layer.

7. An integrated circuit comprising:
a plurality of gate structures, the gate structures are each disposed between a source region and a drain region, wherein a first gate structure of the gate structures includes a first ultra-thin metal layer and a second gate structure of the gate structures does not include the first ultra-thin metal layer, wherein the first gate structure and the second gate structure include a second ultra-thin metal layer, whereby the second ultra-thin metal layer affects the work function of the first gate structure and the second gate structure whereby the first ultra-thin metal layer affects a work function associated with the first gate structure, wherein the gate structures include a third gate structure, the third gate structure not including the first ultra-thin metal layer or the second ultra-thin metal layer, whereby the third gate structure has a work function different than the first gate structure and the second gate structure.

8. An integrated circuit comprising:
a plurality of gate structures, the gate structures are each disposed between a source region and a drain region, wherein a first gate structure of the gate structures includes a first ultra-thin metal layer and a second gate structure of the gate structures does not include the fist ultra-thin metal layer, whereby the first ultra-thin metal layer affects a work function associated with the fist gate structure, wherein the first gate structure and the second gate structure further include polysilicon, wherein the polysilicon is more than 1000 Å thick, wherein the first ultra-thin metal layer is disposed below the polysilicon of the first gate structure and the first and second gate structures include a second ultra-thin layer and the second ultra-thin metal layer is disposed below the polysilicon of the second gate structure.

9. The integrated circuit of claim 8, wherein the first ultra-thin metal layer is nickel or titanium.

10. The integrated circuit of claim 9, wherein the second ultra-thin metal layer is in contact with a dielectric layer and the first ultra-thin metal layer.

11. An integrated circuit comprising:
a plurality of layered gate conductors including a polysilicon layer and a first thin metal layer, wherein a first gate conductor of the gate conductors includes a second thin metal layer and a second gate conductor of the gate conductors does not include the second thin metal layer wherein the first thin metal layer is disposed below the polysilicon layer.

12. The integrated circuit of claim 11, wherein the polysilicon layer is 1000–2000 Å thick.

13. The integrated circuit of claim 11 wherein each layered gate conductor of the layered gate conductors includes a silicide layer.

14. The integrated circuit of claim 11, wherein the first thin metal layer is less an 30 Å thick.

15. The integrated circuit of claim 14, wherein the gate structures are disposed on an SOI substrate.

16. The integrated circuit of claim 15, wherein the first tin metal layer includes nickel or titanium.

17. The integrated circuit of claim 16, wherein the first thin metal layer and the second thin metal layer are different materials.

18. The integrated circuit of claim 11, wherein the first thin metal layer is a nickel or a titanium layer.

19. The integrated circuit of claim 11, wherein the second metal layer disposed is below the polysilicon layer.

* * * * *

UNITED STATES PATENT AND TRADEMARK OFFICE
CERTIFICATE OF CORRECTION

PATENT NO. : 6,693,333 B1
DATED : February 17, 2004
INVENTOR(S) : Bin Yu

It is certified that error appears in the above-identified patent and that said Letters Patent is hereby corrected as shown below:

Column 9,
Line 5, insert -- layer -- after "metal".
Line 6, delete "a" before "structure".

Column 10,
Lines 1 and 3, delete "fist" and insert therefor -- first --.
Line 31, delete "an" and insert therefor -- than --.
Line 34, delete "tin" and insert therefor -- thin --.

Signed and Sealed this

First Day of June, 2004

JON W. DUDAS
*Acting Director of the United States Patent and Trademark Office*